United States Patent
Chi et al.

(10) Patent No.: US 8,202,797 B2
(45) Date of Patent: Jun. 19, 2012

(54) INTEGRATED CIRCUIT SYSTEM WITH RECESSED THROUGH SILICON VIA PADS AND METHOD OF MANUFACTURE THEREOF

(75) Inventors: HeeJo Chi, Ichon-si (KR); NamJu Cho, Uiwang-si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 156 days.

(21) Appl. No.: 12/820,491

(22) Filed: Jun. 22, 2010

(65) Prior Publication Data

US 2011/0309492 A1 Dec. 22, 2011

(51) Int. Cl.
*H01L 21/44* (2006.01)

(52) U.S. Cl. ........ 438/613; 438/612; 438/614; 257/737; 257/738

(58) Field of Classification Search ................... 438/612, 438/613, 614; 257/737, 738, E21.508, E21.589
See application file for complete search history.

(56) References Cited

U.S. PATENT DOCUMENTS

| | | | |
|---|---|---|---|
| 6,873,054 B2 | 3/2005 | Miyazawa et al. | |
| 6,908,856 B2 | 6/2005 | Beyne et al. | |
| 6,998,344 B2 | 2/2006 | Akram et al. | |
| 7,282,431 B2 | 10/2007 | Kang et al. | |
| 7,291,929 B2 | 11/2007 | Tanaka et al. | |
| 7,354,798 B2 | 4/2008 | Pogge et al. | |
| 7,378,342 B2 * | 5/2008 | Kirby et al. | 438/638 |
| 8,039,302 B2 * | 10/2011 | Tay et al. | 438/106 |
| 8,039,303 B2 * | 10/2011 | Shim et al. | 438/107 |
| 2007/0284729 A1 | 12/2007 | Kwon et al. | |
| 2008/0237881 A1 | 10/2008 | Dambrauskas et al. | |
| 2009/0014843 A1 | 1/2009 | Kawashita et al. | |

OTHER PUBLICATIONS

U.S. Appl. No. 12/334,347, filed Dec. 12, 2008, Do et al.

* cited by examiner

*Primary Examiner* — Phuc Dang
(74) *Attorney, Agent, or Firm* — Ishimaru & Associates LLP; Mikio Ishimaru; Stanley Chang

(57) ABSTRACT

A method of manufacture of an integrated circuit system includes: providing a substrate with a face surface having a via therein and a back surface having a trench therein; filling the via with a conductive pillar; forming a recessed contact pad in the trench; filling the recessed contact pad partially with solder; and forming an under-bump metal having a base surface in electrical contact with the conductive pillar, and having sides that extend away from the face surface of the substrate and further extend beyond the base surface.

20 Claims, 10 Drawing Sheets

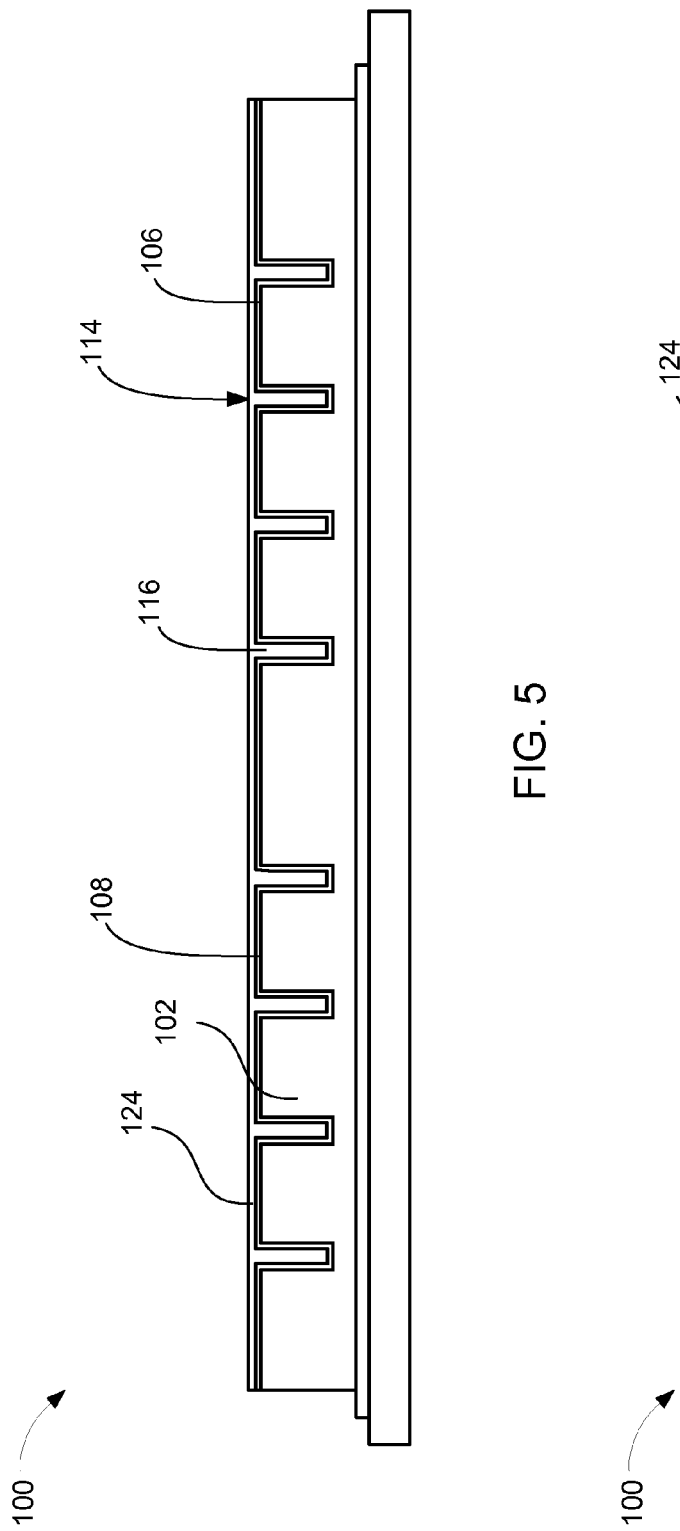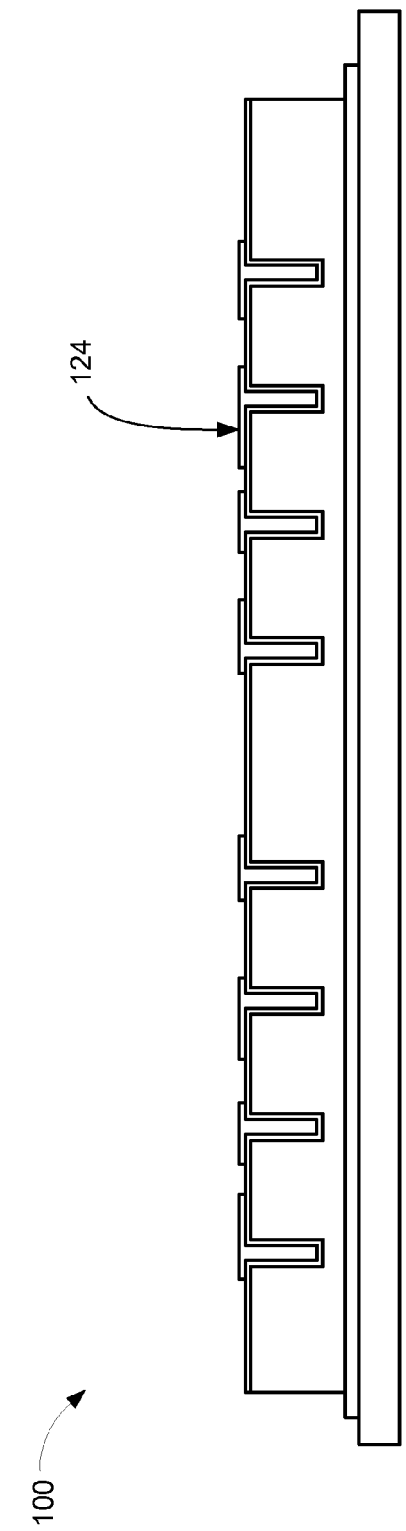

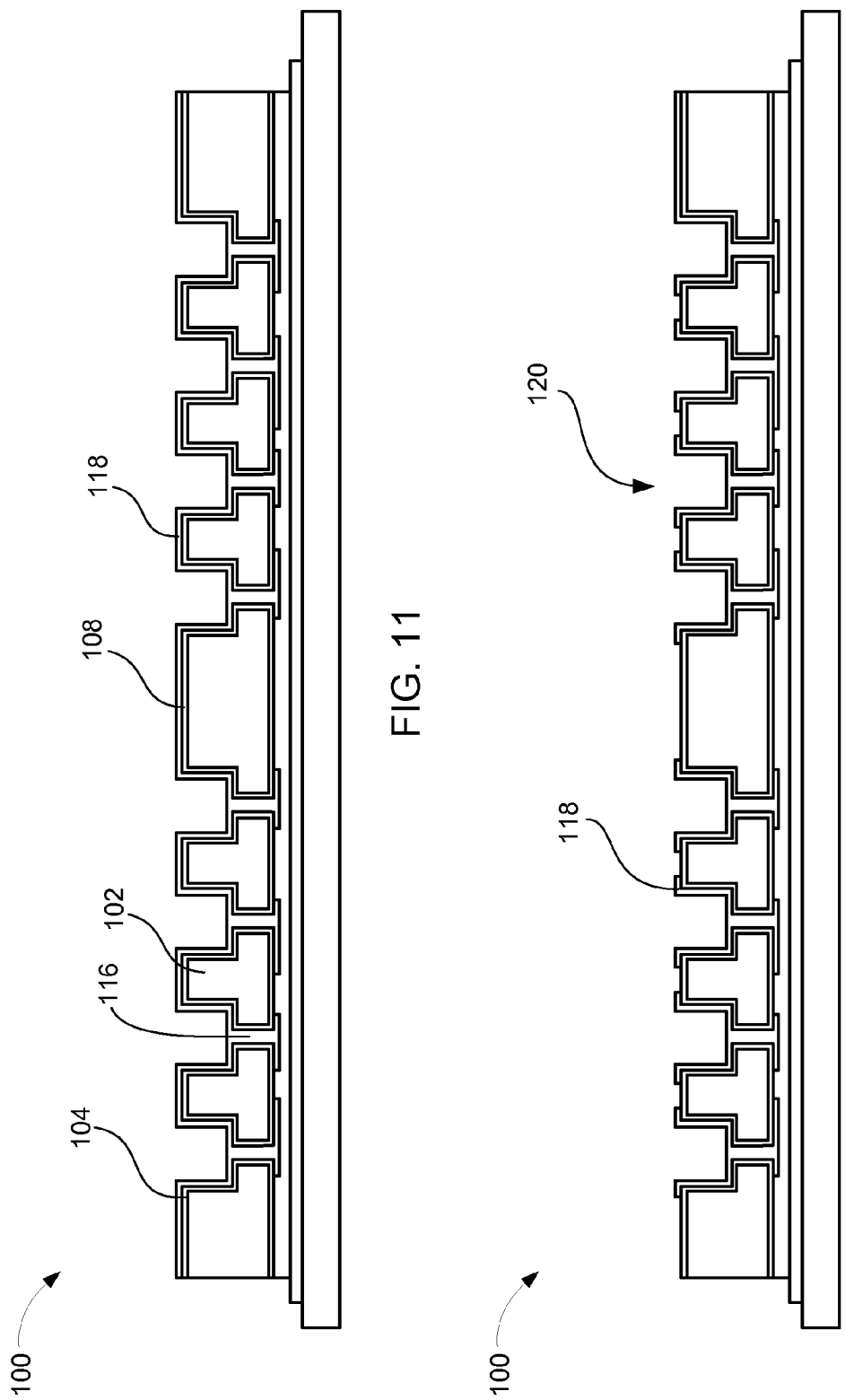

INTEGRATED CIRCUIT SYSTEM WITH RECESSED THROUGH SILICON VIA PADS AND METHOD OF MANUFACTURE THEREOF

TECHNICAL FIELD

The present invention relates generally to an integrated circuit system, and more particularly to a system for utilizing recessed through silicon via pads in an integrated circuit system.

BACKGROUND

The rapidly growing market for portable electronics devices, e.g. cellular phones, laptop computers, and PDAs, is an integral facet of modern life. The multitude of portable devices represents one of the largest potential market opportunities for next generation computer chips. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current computer chip suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller package footprints and more robust computer chips. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing a substrate with a face surface having a via therein and a back surface having a trench therein; filling the via with a conductive pillar; forming a recessed contact pad in the trench; filling the recessed contact pad partially with solder; and forming an under-bump metal having a base surface in electrical contact with the conductive pillar, and having sides that extend away from the face surface of the substrate and further extend beyond the base surface.

The present invention provides an integrated circuit system, including: a substrate with a face surface having a via therein and a back surface having a trench therein; a conductive pillar within the via; a recessed contact pad within the trench; solder that partially fills the recessed contact pad; and an under-bump metal having a base surface in electrical contact with the conductive pillar, and having a side that extends beyond and extends away from the face surface of the substrate and further extends beyond the base surface.

Certain embodiments of the invention have other steps or elements in addition to or in place of those mentioned above. The steps or element will become apparent to those skilled in the art from a reading of the following detailed description when taken with reference to the accompanying drawings.

BRIEF DESCRIPTION OF THE DRAWINGS

FIG. 5 is the integrated circuit system of FIG. 1 after a via plating phase of manufacture.

FIG. 6 is the integrated circuit system of FIG. 1 after a circuit patterning phase of manufacture.

FIG. 11 is the integrated circuit system of FIG. 1 after a trench plating phase of manufacture.

FIG. 12 is the integrated circuit system of FIG. 1 after a patterning phase of manufacture.

BEST MODE FOR CARRYING OUT THE INVENTION

Figure 1:
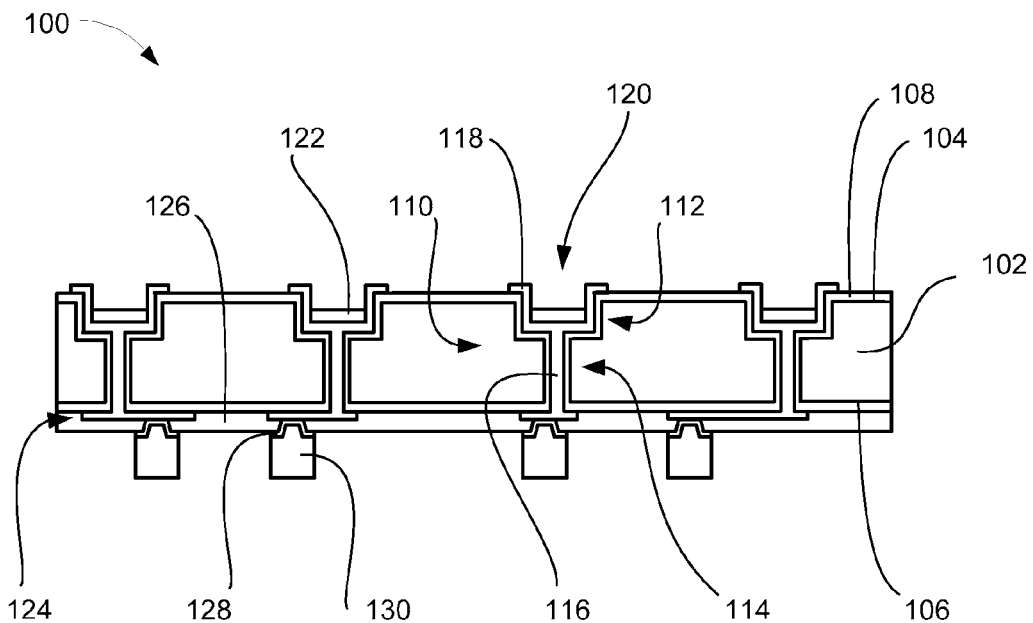
FIG. 1 is a cross-sectional view of an integrated circuit system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit system 100 in an embodiment of the present invention. The integrated circuit system 100 such as a through silicon via die is shown having a substrate 102 such as Silicon or Gallium arsenide integrated circuit. The substrate 102 is shown having a back surface 104 and a face surface 106. The back surface 104 and the face surface 106 are covered with an oxidation layer 108 such as Silicon dioxide.

The substrate 102 is further depicted having Through-silicon via interconnects (TSV interconnects 110) that provide electrical and signal connection from the back surface 104 of the substrate 102 to the face surface 106 of the substrate 102.

The TSV interconnect 110 is shown composed of a trench 112 and a via 114. The trench 112 portion of the TSV interconnect 110 is formed into the back surface 104 of the substrate 102, while the via 114 is formed into the face surface 106 of the substrate 102. The trench 112 is shown having a flat taper but may also be formed with an angled taper or a curved taper to aid alignment.

The trench 112 and the via 114 are shown having the oxidation layer 108 formed lining the trench 112 and the via 114 in direct contact with the substrate 102. The via 114 is shown having a conductive pillar 116 formed within the via 114 and filling the via 114 from the face surface 106 of the substrate 102 to the trench 112.

The trench 112 is lined with a metal layer 118 that forms a recessed contact pad 120. The metal layer 118 is in direct contact with the oxidation layer 108 lining the trench 112 and covers a portion of the oxidation layer 108 that covers the back surface 104 of the substrate 102. The recessed contact pad 120 is further formed by partially filling the trench 112 with 122. The conductive pillar 116 is show in direct contact with the metal layer 118 of the recessed contact pad 120.

The conductive pillar 116 is further shown as electrically connected to a wiring layer 124 near the face surface 106 of the substrate 102. The wiring layer 124 is shown as one layer for simplification of description; however in practice this layer may consist of many layers to rout electrical signals.

The wiring layer 124 is formed below the oxidation layer 108 covering the face surface 106 of the substrate 102. Formed around the wiring layer 124 is a passivation layer 126 such as Polyimide or Benzocyclobutene. The passivation layer 126 covers and encapsulates the oxide layer 108 on the face surface 106 of the substrate 102 and the wiring layer 124.

Formed through the passivation layer 126 is an under-bump metal 128. The under-bump metal 128 is shown contacting the wiring layer 124 at various points that may be designed and arranged for precise integration with external contacts (not shown). The under-bump metal 128 is in direct contact with the wiring layer 124 and is exposed from the passivation layer 126.

Formed in direct contact with the under-bump metal 128 is a conductive post 130 such as Copper or Nickel. The metal post 130 is substantially the same width as the under-bump metal 128 and is formed as a substantially rectangular post projected away from the face surface 106 of the substrate 102.

Figure 2:
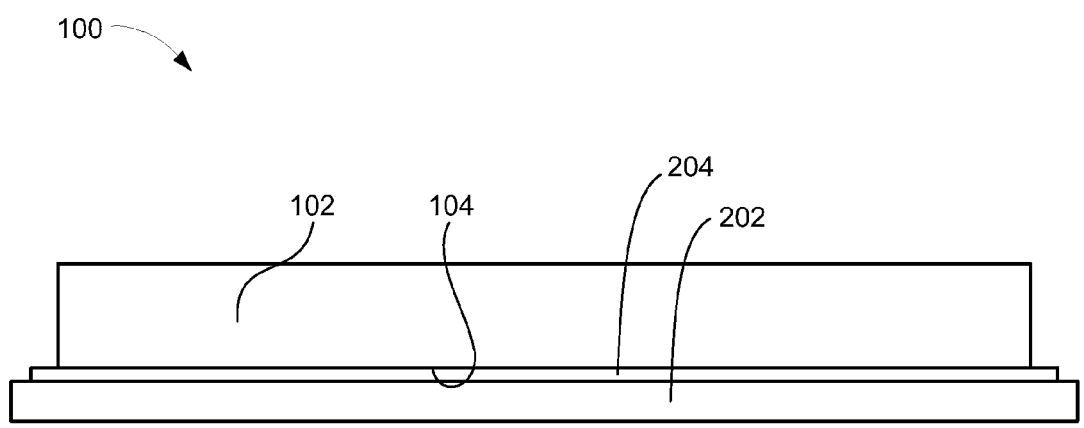
FIG. 2 is the integrated circuit system of FIG. 1 after a wafer preparation phase of manufacture.

Referring now to FIG. 2, therein is shown the integrated circuit system 100 of FIG. 1 after a wafer preparation phase of manufacture. The integrated circuit system 100 is shown having the back surface 104 of the substrate 102 attached to a first supporting carrier 202 with an adhesive 204.

Figure 3:
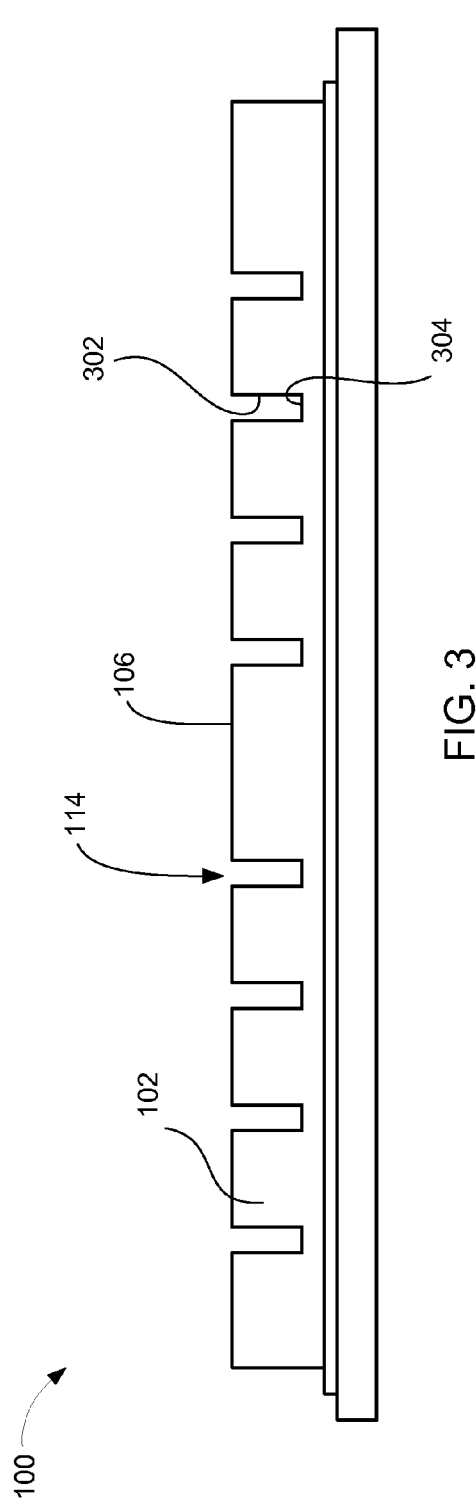
FIG. 3 is the integrated circuit system of FIG. 1 after a via etching phase of manufacture.

Referring now to FIG. 3, therein is shown the integrated circuit system 100 of FIG. 1 after a via etching phase of manufacture. The integrated circuit system 100 is shown having the vias 114 formed into the face surface 106 of the substrate 102. The vias 114 are formed partially through the substrate 102.

The vias 114 are shown having substantially vertical sides 302 and a substantially horizontal and flat bottom 304.

Figure 4:
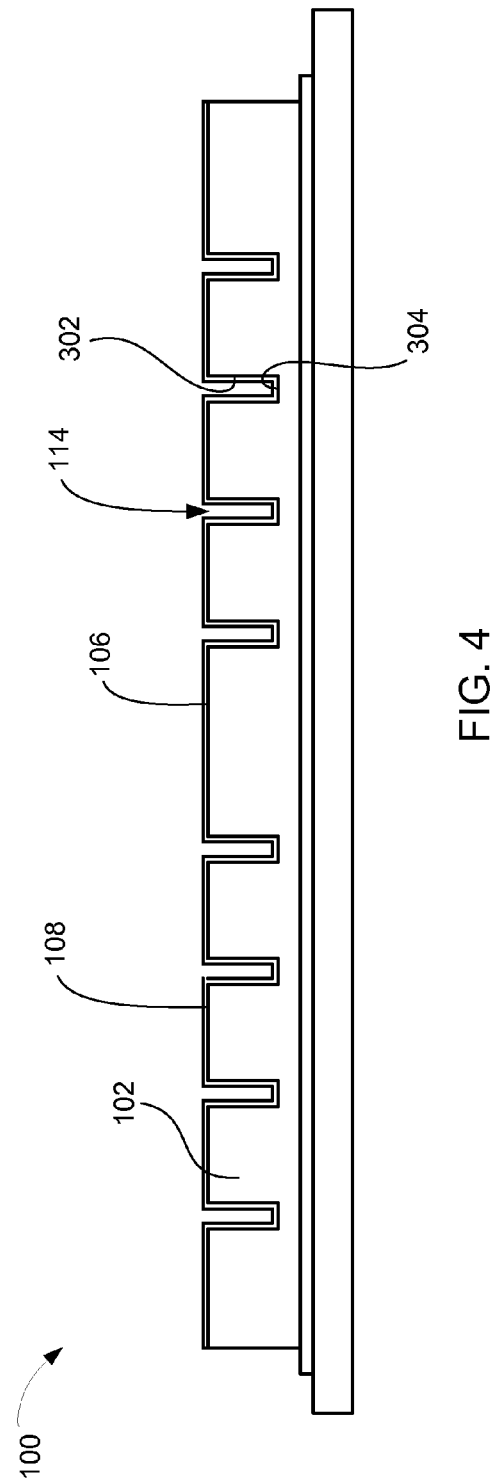
FIG. 4 is the integrated circuit system of FIG. 1 after a via oxidation phase of manufacture.

Referring now to FIG. 4, therein is shown the integrated circuit system 100 of FIG. 1 after a via oxidation phase of manufacture. The integrated circuit system 100 is shown having the oxidation layer 108 formed in the vias 114 and along the face surface 106 of the substrate 102.

The oxidation layer 108 is shown covering the vertical sides 302 and the flat bottom 304 of the vias 114. This oxide layer 108 provides insulation for conductive and semi conductive elements within the substrate 102.

Referring now to FIG. 5, therein is shown the integrated circuit system 100 of FIG. 1 after a via plating phase of manufacture. The integrated circuit system 100 is shown having the conductive pillar 116 formed within the via 114 and in direct contact with the oxidation layer 108 within the via 114.

The wiring layer 124 is shown at this point partially formed above the face surface 106 of the substrate 102. The wiring layer 124 is formed over the oxidation layer 108 on the face surface 106 of the substrate 102.

Referring now to FIG. 6, therein is shown the integrated circuit system 100 of FIG. 1 after a circuit patterning phase of manufacture. The integrated circuit system 100 is shown having the wiring layer 124 patterned and isolated to provide electrical conduits for routing signals between elements of the semiconductor and external connections. The wiring layer 124 is shown as a single layer but may in practice be formed of multiple layers of conductive and insulating materials. This backend process is generally accomplished through multiple photo-lithography processes, etchings, and growth of oxide layers.

Figure 7:
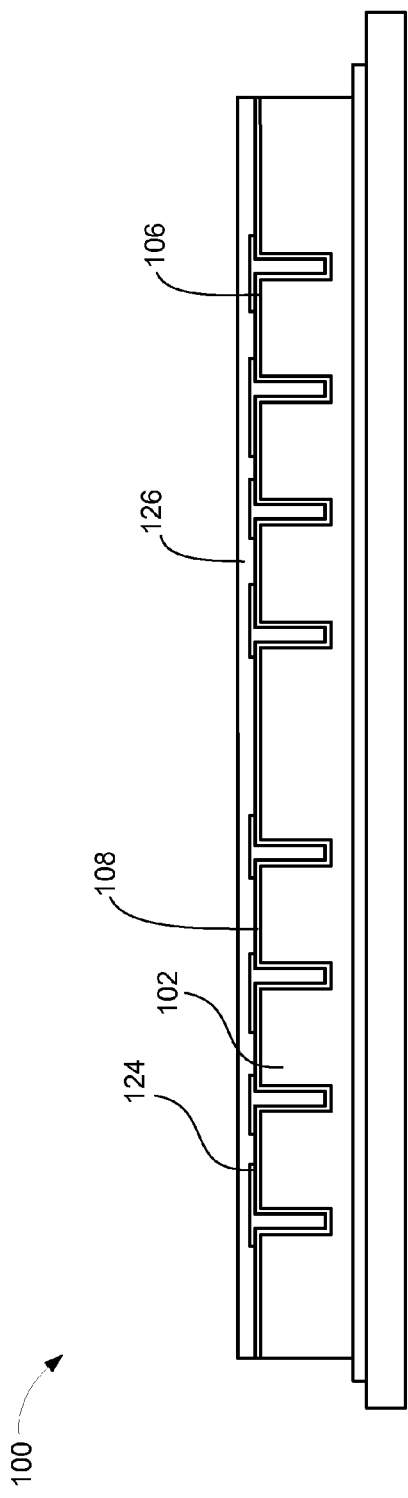
FIG. 7 is the integrated circuit system of FIG. 1 after a passivation phase of manufacture.

Referring now to FIG. 7, therein is shown the integrated circuit system 100 of FIG. 1 after a passivation phase of manufacture. The integrated circuit system 100 is shown having the passivation layer 126 is shown formed completely covering the wiring layer 124 and over the oxidation layer 108 not covered by the wiring layer 124 over the face surface 106 of the substrate.

Figure 8:
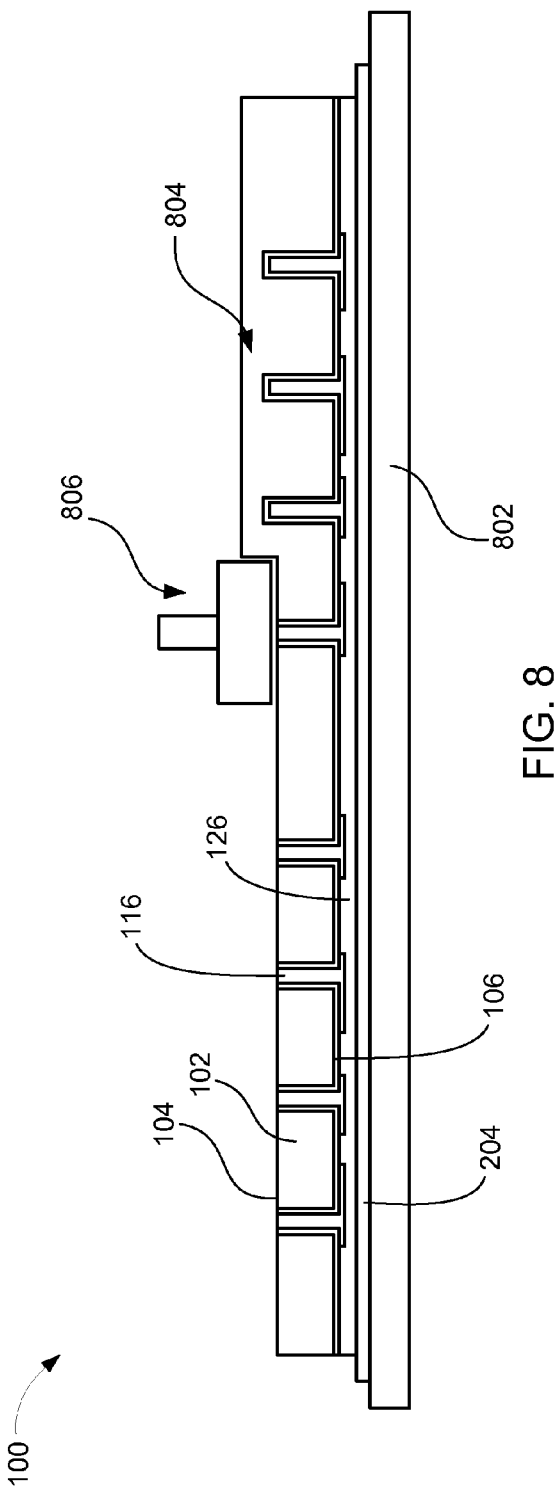
FIG. 8 is the integrated circuit system of FIG. 1 during a backside grinding phase of manufacture.

Referring now to FIG. 8, therein is shown the integrated circuit system 100 of FIG. 1 during a backside grinding phase of manufacture. The integrated circuit system 100 is shown having the face surface 106 of the substrate 102 mounted toward a second supporting carrier 802.

Specifically, the passivation layer 126 is attached to the second supporting carrier 802 with the adhesive 204. Further, a back portion 804 of the substrate 102 is shown being removed with a grinding wheel 806 to expose the back surface 104 of the substrate 102 and the conductive pillars 116.

Figure 9:
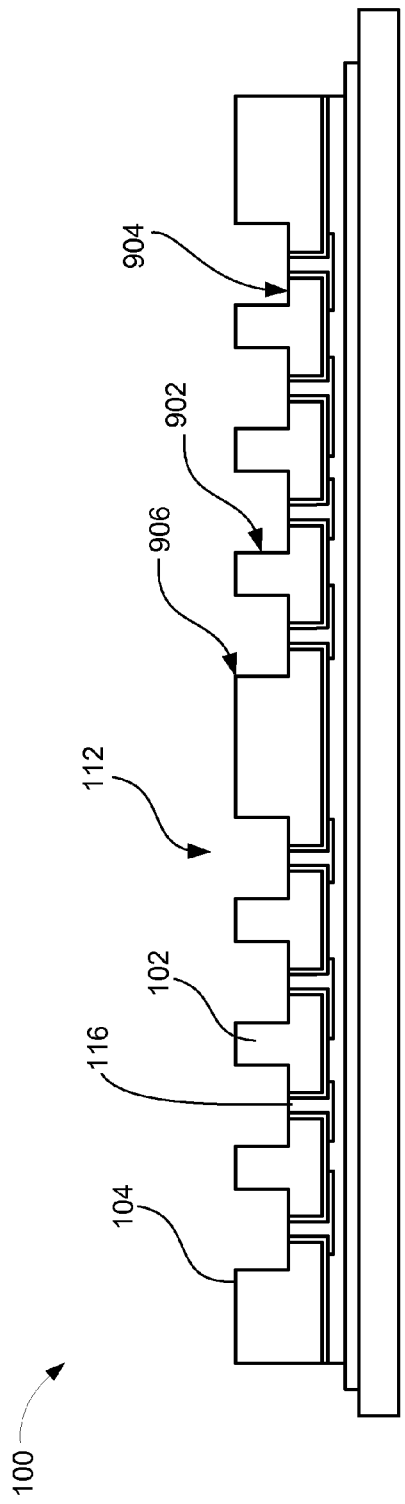
FIG. 9 is the integrated circuit system of FIG. 1 after a trenching phase of manufacture.

Referring now to FIG. 9, therein is shown the integrated circuit system 100 of FIG. 1 after a trenching phase of manufacture. The integrated circuit system 100 is shown having the trenches 112 formed into the back surface 104 of the substrate 102.

The trench 112 is shown having sides 902 that are substantially flat and vertical. However, the trench 112 may be formed having the sides 902 that taper in at an angle or that are curved. At a bottom 904 of the trench 112 the conductive pillar 116 is shown exposed inside the trench 112.

The bottom 904 of the trench is shown as substantially flat but may be formed with a taper or a curvature away from the back surface 104 of the substrate 102. The trench 112 is further depicted having square corners 906 where the sides 902 of the trench 112 meet the back surface 104 of the substrate 102.

The trench 112 structure may be formed by deep reactive ion etching (DRIE) or other known methods. The conductive pillar 116 may also be etched to produce the trench 112 by utilizing chemical etching or DRIE.

Figure 10:
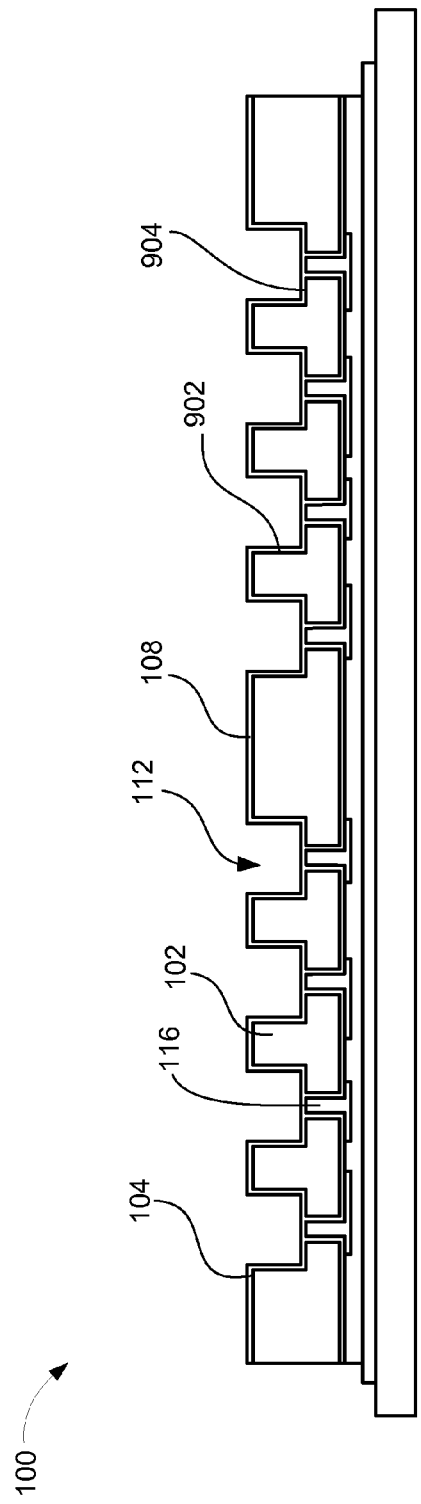
FIG. 10 is the integrated circuit system of FIG. 1 after a trench oxidation phase of manufacture.

Referring now to FIG. 10, therein is shown the integrated circuit system 100 of FIG. 1 after a trench oxidation phase of manufacture. The integrated circuit system 100 is shown having the oxidation layer 108 formed on the back surface 104 of the substrate 102 and directly on the sides 902 and bottom 904 of the trench 112. The oxidation layer 108 is shown at this phase of manufacture to cover the conductive pillars 116 near the bottom 904 of the trench 112.

Referring now to FIG. 11, therein is shown the integrated circuit system 100 of FIG. 1 after a trench plating phase of manufacture. The integrated circuit system 100 is shown having the oxidation layer 108 that covered the conductive pillar 116 in FIG. 10 removed.

The conductive pillar 116 is now shown in direct contact with the metal layer 118, while the metal layer 118 and the conductive pillar 116 have the oxidation layer 108 insulating between the substrate 102. The metal layer 118 is formed over the oxidation layer 108 on the back surface 104 of the substrate 102 and may be formed by sputtering and electro plating.

Referring now to FIG. 12, therein is shown the integrated circuit system 100 of FIG. 1 after a patterning phase of manufacture. The integrated circuit system 100 is shown having the metal layer 118 patterned to form the recessed contact pads 120. The contact pads 120 may be patterned by employing photolithography and chemical etching.

Figure 13:
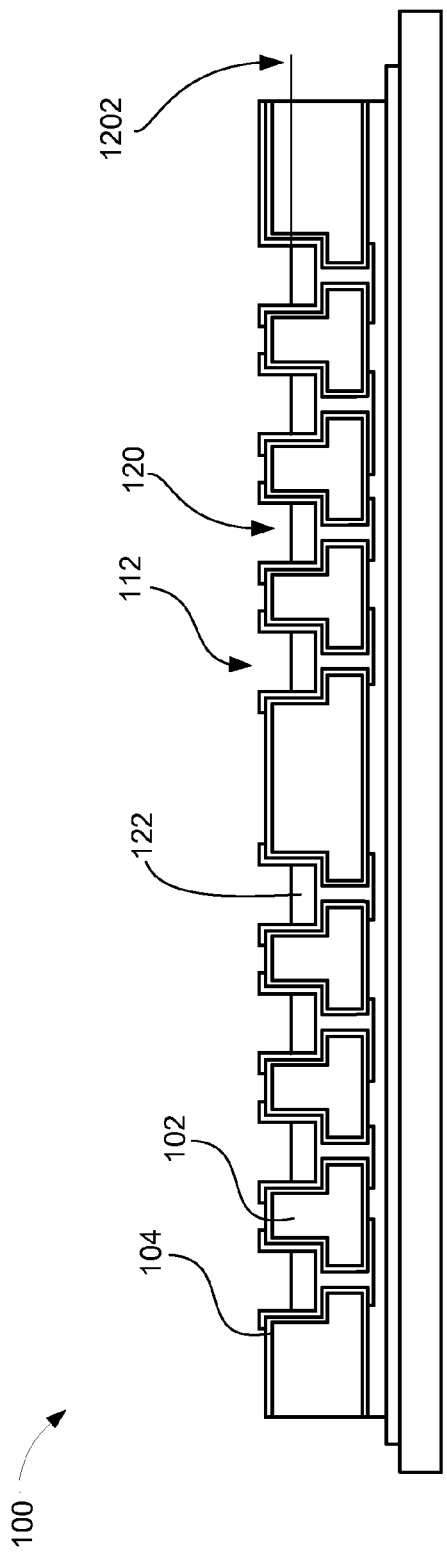
FIG. 13 is the integrated circuit system of FIG. 1 after a solder filling phase of manufacture.

Referring now to FIG. 13, therein is shown the integrated circuit system 100 of FIG. 1 after a solder filling phase of manufacture. The integrated circuit system 100 is shown having the recessed contact pads 120 partially filled with the solder 122. The solder 122 may be deposited by utilizing stencil plating, u-ball dropping, plating or other known methods. The solder 122 is shown only partially filling the trenches 112 to a level 1202 below the back surface 104 of the substrate 102.

Figure 14:
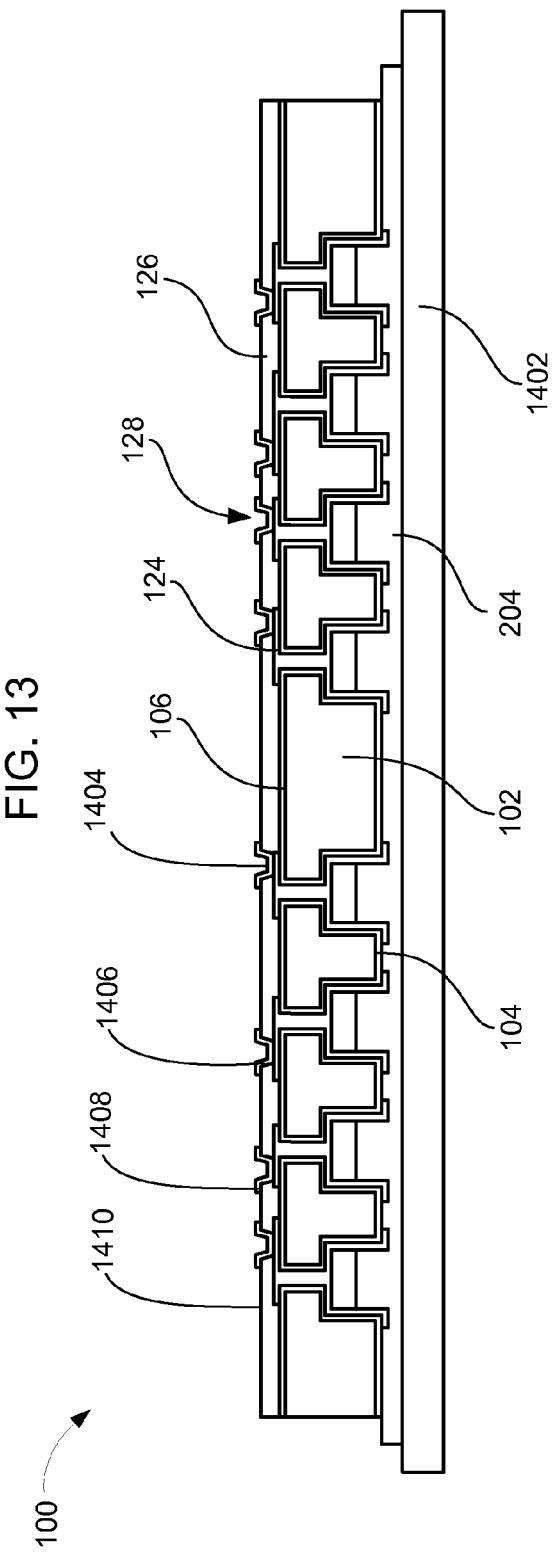
FIG. 14 is the integrated circuit system of FIG. 1 after an under-bump metal forming phase of manufacture.

Referring now to FIG. 14, therein is shown the integrated circuit system 100 of FIG. 1 after an under-bump metal forming phase of manufacture. The integrated circuit system 100 is shown having the back surface 104 of the substrate 102 mounted with the adhesive 204 to a third supporting carrier 1402.

The under-bump metal 128 is shown formed through the passivation layer 126 and in contact with the wiring layer 124. The under-bump metal 128 is shown having a base surface 1404 in direct contact with the wiring layer 124.

In direct contact with the passivation layer 126, the under-bump metal 128 is shown having sides 1406 that extend away from the face surface 106 of the substrate 102 and above the passivation layer 126. The under-bump metal 128 is also shown having top flanges 1408 that are in direct contact with a top surface 1410 of the passivation layer 126 and that are over the passivation layer 126.

Figure 15:
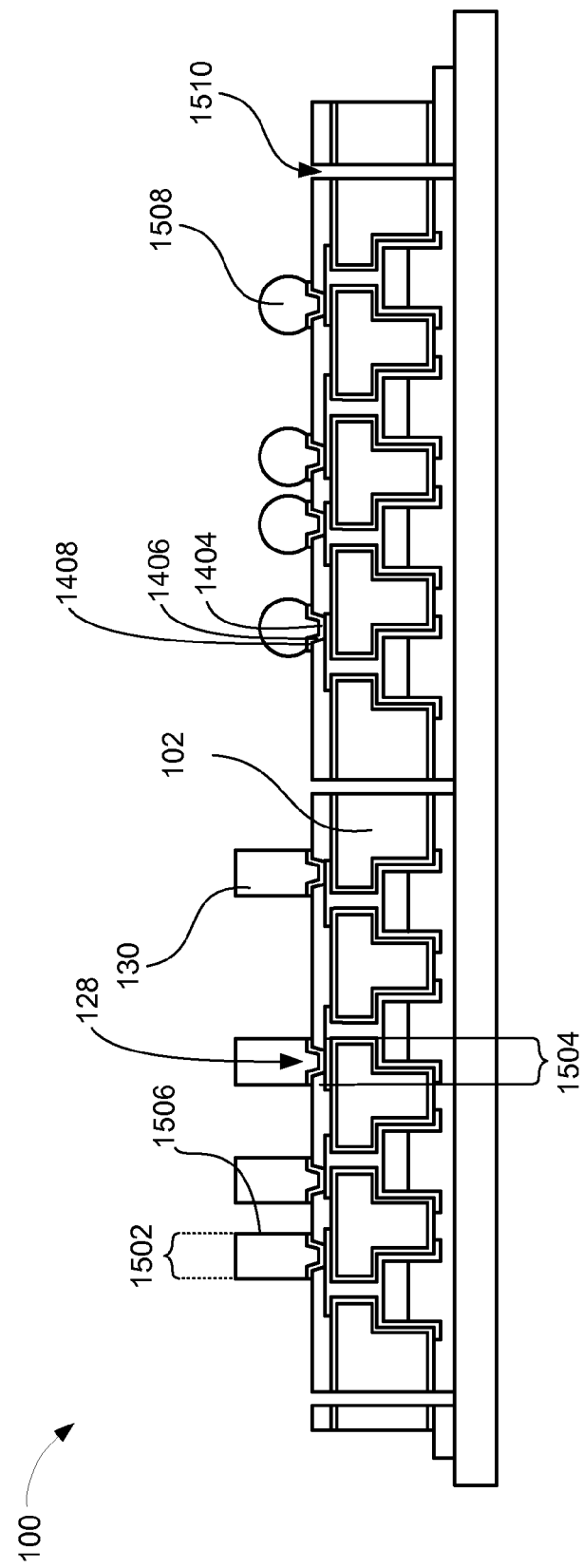
FIG. 15 is the integrated circuit system of FIG. 1 after a post forming phase of manufacture.

Referring now to FIG. 15, therein is shown the integrated circuit system 100 of FIG. 1 after a post forming phase of manufacture. The integrated circuit system 100 is shown having the conductive post 130 formed in direct contact with the under-bump metal 128.

The conductive post 130 is shown having a width 1502 that is substantially similar to a width 1504 of the under-bump metal 128. The conductive post 130 is shown formed on the base surface 1404, the sides 1406, and the flanges 1408 of the under-bump metal 128. It has been discovered that the width 1502 of the conductive post 130 smaller than the width 1504 of the under-bump metal 128 is critical to increasing I/O density, and decreasing the pitch of the conductive posts 130.

The conductive post 130 is also shown having substantially vertical sides 1506. Solder bumps 1508 may be formed instead of or in combination with the conductive post 130 above the under-bump metal 128. The substrate 102 is further shown having singulation lines 1510 through the substrate 102.

Figure 16:
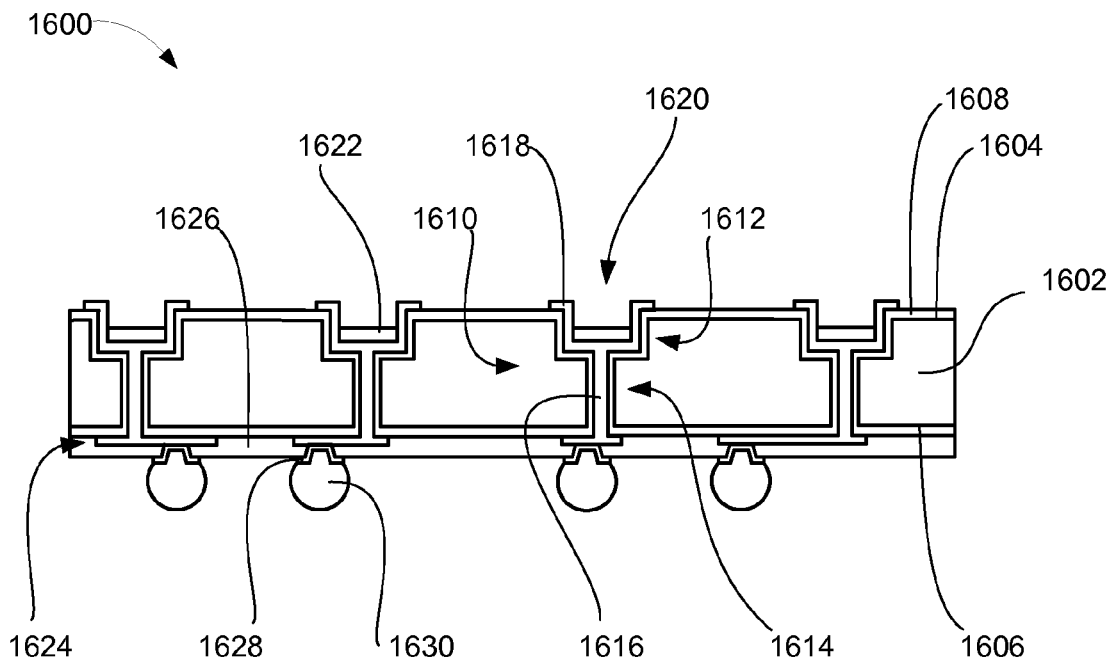
FIG. 16 is a cross-sectional view of an integrated circuit system in a further embodiment of the present invention.

Referring now to FIG. 16, therein is shown a cross-sectional view of an integrated circuit system 1600 in a further embodiment of the present invention. The integrated circuit system 1600 is shown having a substrate 1602 such as Silicon or Gallium arsenide. The substrate 1602 is shown having a back surface 1604 and a face surface 1606. The back surface 1604 and the face surface 1606 are covered with an oxidation layer 1608 such as Silicon dioxide.

The substrate 1602 is further depicted having TSV interconnects 1610 that provide electrical and signal connection from the back surface 1604 of the substrate 1602 to the face surface 1606 of the substrate 1602.

The TSV interconnect 1610 is shown composed of a trench 1612 and a via 1614. The trench 1612 portion of the TSV interconnect 1610 is formed into the back surface 1604 of the substrate 1602, while the via 1614 is formed into the face surface 1606 of the substrate 1602. The trench 1612 is shown having a flat taper but may also be formed with an angled taper or a curved taper to aid alignment.

The trench 1612 and the via 1614 are shown having the oxidation layer 1608 formed lining the trench 1612 and the via 1614 in direct contact with the substrate 1602. The via 1614 is shown having a conductive pillar 1616 formed within the via 1614 and filling the via 1614 from the face surface 1606 of the substrate 1602 to the trench 1612.

The trench 1612 is lined with a metal layer 1618 that forms a recessed contact pad 1620. The metal layer 1618 is in direct contact with the oxidation layer 1608 lining the trench 1612 and covers a portion of the oxidation layer 1608 that covers the back surface 1604 of the substrate 1602. The recessed contact pad 1620 is further formed by partially filling the trench 1612 with solder 1622. The conductive pillar 1616 is show in direct contact with the metal layer 1618 of the recessed contact pad 1620.

The conductive pillar 1616 is further shown as electrically connected to a wiring layer 1624 near the face surface 1606 of the substrate 1602. The wiring layer 1624 is shown as one layer for simplification of description, however in practice this layer may consist of many layers to rout electrical signals.

The wiring layer 1624 is formed below the oxidation layer 1608 covering the face surface 1606 of the substrate 1602. Formed around the wiring layer 1624 is a passivation layer 1626 such as Polyimide or Benzocyclobutene. The passivation layer 1626 covers and encapsulates the oxide layer 1608 on the face surface 1606 of the substrate 1602 and the wiring layer 1624.

Formed through the passivation layer 1626 is an under-bump metal 1628. The under-bump metal 1628 is shown contacting the wiring layer 1624 at various points that may be designed and arranged for precise integration with external contacts (not shown). The under-bump metal 1628 is in direct contact with the wiring layer 1624 and is exposed from the passivation layer 1626.

Formed in direct contact with the under-bump metal 1628 is a solder bump 1630. The solder bump 1630 may be used as an external interconnect to electrically connect to external components or for board level integration. It is also possible to join the solder bump 1630 to a recessed contact pad partially filled with solder (not shown).

Figure 17:
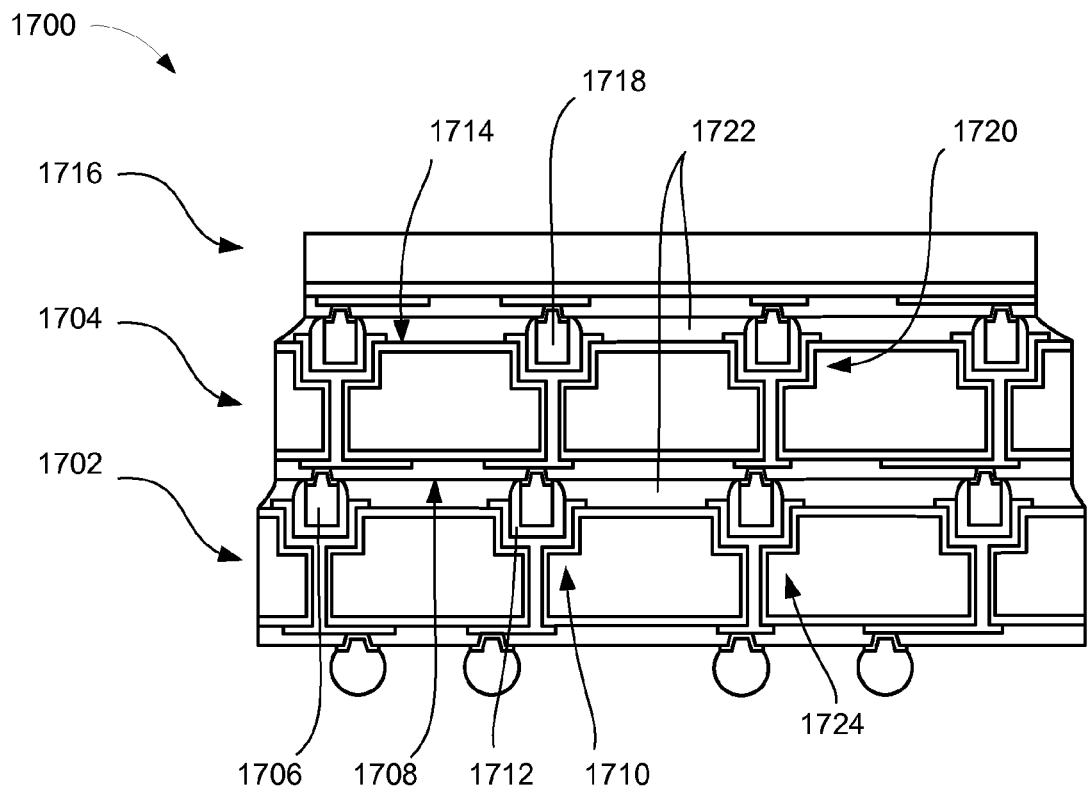
FIG. 17 is a cross-sectional view of an integrated circuit system in a further embodiment of the present invention.

Referring now to FIG. 17, therein is shown a cross-sectional view of an integrated circuit system 1700 in a further embodiment of the present invention. The integrated circuit system 1700 is shown having a first integrated circuit 1702 such as the integrated circuit system of FIG. 16 and having a second integrated circuit 1704 such as the integrated circuit system of FIG. 1 mounted above the first integrated circuit 1702. The second integrated circuit 1704 is offset over the first integrated circuit 1702.

The second integrated circuit 1704 is shown having conductive posts 1706 formed on a face surface 1708 of the second integrated circuit 1704. The conductive posts 1706 of the second integrated circuit 1704 are inserted into recessed contact pads 1710 of the first integrated circuit 1702 and having solder 1712 anchoring the conductive posts 1706 within the recessed contact pads 1710. It has been discovered that that the conductive post 1706 and recessed contact pads 1710 geometry yield greatly increased bonding adhesion strength.

It has further been discovered that utilizing the conductive post 1706 within the recessed contact pads 1720 improves process efficiency by decreasing waste because the combination inherently supplies a highly sufficient solder volume and solder wetting around the conductive post 1706.

It has yet further been discovered that the increased bonding adhesion strength and greater solder wetting substantially improves the quality of the electrical connection and mechanical adhesion between the first integrated circuit 1702 and the second integrated circuit 1704.

Electrically connected to a back surface 1714 of the second integrated circuit 1704 is a third integrated circuit such as a flip-chip 1716. The flip-chip 1716 is connected with flip-chip conductive posts 1718 similar to the conductive posts of the second integrated circuit 1704.

The flip-chip conductive posts are attached within recessed contact pads 1720 on the back surface 1714 of the second integrated circuit 1704. Between the flip chip 1716 and the second integrated circuit 1704 and between the second integrated circuit 1704 and the first integrated circuit 1702 is an optional underfill 1722.

Figure 18:
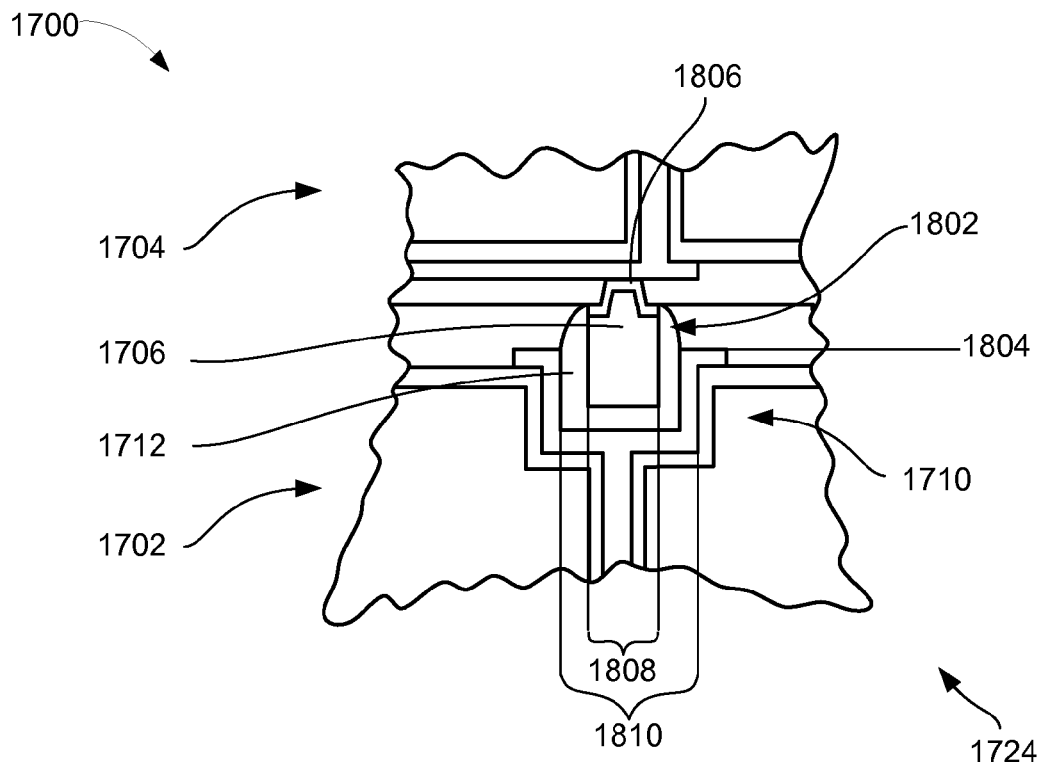
FIG. 18 is a magnified region of the integrated circuit system of FIG. 17.

Referring now to FIG. 18, therein is shown a magnified region 1724 of the integrated circuit system 1700 of FIG. 17. The integrated circuit system 1700 is shown having the conductive post 1706 of the second integrated circuit 1704 are inserted into recessed contact pad 1710 of the first integrated circuit 1702 and having the solder 1712 anchoring the conductive post 1706 within the recessed contact pad 1710.

The conductive post 1706 is shown having a portion 1802 of the conductive post 1706 above a top level 1804 of the recessed contact pad 1710 of the first integrated circuit 1702. An under-bump metal 1806 of the second integrated circuit 1704 is also shown above the top level 1804 of the first integrated circuit 1702.

The conductive post 1706 is shown having a width 1808 that is less than an inner width 1810 of the recessed contact pad 1710. It has been discovered that the width 1808 of the conductive post 1706 is critical to improve solder wetting to the conductive post and to the align the conductive post 1706.

The solder 1712 is shown surrounding the conductive post 1706, the under-bump metal 1806, and the portion 1802 of the conductive post 1706 that is above the top level of the first integrated circuit 1702. The solder 1712 may taper in toward the conductive post 1706 further from the first integrated circuit 1702.

The solder 1712 produces a very firm adhesion to the conductive post 1706 after reflow. The solder 1712 is shown between the conductive post 1706 and the recessed contact pad 1710 with the conductive post 1706 not in direct contact with the recessed contact pad 1710.

Figure 19:
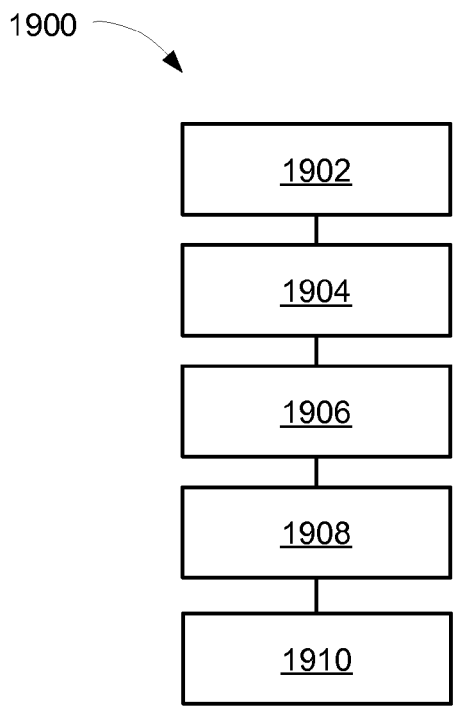
FIG. 19 is a flow chart of a method of manufacture of the integrated circuit system of FIG. 1.

Referring now to FIG. 19, therein is shown a flow chart of a method 1900 of manufacture of the integrated circuit system 100 of FIG. 1. The method 1900 includes providing a substrate with a face surface having a via therein and a back surface having a trench therein in a block 1902; filling the via with a conductive pillar in a block 1904; forming a recessed contact pad in the trench in a block 1906; filling the recessed contact pad partially with solder in a block 1908; and forming an under-bump metal having a base surface in electrical contact with the conductive pillar, and having sides that extend away from the face surface of the substrate and further extend beyond the base surface in a block 1910.

Thus, it has been discovered that the recessed contact pad system of the present invention furnishes important and heretofore unknown and unavailable solutions, capabilities, and functional aspects for integrated circuit system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit system comprising:
   providing a substrate with a face surface having a via therein and a back surface having a trench therein;
   filling the via with a conductive pillar;
   forming a recessed contact pad in the trench;
   filling the recessed contact pad partially with solder; and
   forming an under-bump metal having a base surface in electrical contact with the conductive pillar, and having sides that extend away from the face surface of the substrate and further extend beyond the base surface.

2. The method as claimed in claim 1 further comprising:
   forming an oxidation layer between the conductive pillar and the substrate and between the recessed contact pad and the substrate.

3. The method as claimed in claim 1 further comprising:
   forming a wiring layer near the face surface of the substrate and electrically connected to the conductive pillar.

4. The method as claimed in claim 1 wherein:
   providing the substrate includes providing an integrated circuit.

5. The method as claimed in claim 1 further comprising:
   mounting an integrated circuit to the back surface of the substrate, the integrated circuit having a conductive post mounted within the recessed contact pad and having the solder surrounding a portion of the conductive post above a top level of the recessed contact pad.

6. A method of manufacture of an integrated circuit system comprising:
   providing a substrate with a face surface having a via therein and a back surface having a trench therein;
   filling the via with a conductive pillar;
   forming a recessed contact pad in the trench;
   filling the recessed contact pad partially with solder;
   forming an under-bump metal having a base surface in electrical contact with the conductive pillar, and having sides that extend away from the face surface of the substrate and further extend beyond the base surface; and
   forming a solder bump, a conductive post, or a combination thereof in direct contact with the under-bump metal.

7. The method as claimed in claim 6 wherein:
   forming the conductive post includes the conductive post having a width that is substantially similar to a width of the under-bump metal.

8. The method as claimed in claim 6 wherein:
   forming the conductive post having a width that is less than an inner width of the recessed contact pad.

9. The method as claimed in claim 6 further comprising:
   forming a passivation layer having a top surface near the face surface of the substrate; and
   forming a top flange as part of the under-bump metal in direct contact with the top surface of the passivation layer and the top flange is over the passivation layer.

10. The method as claimed in claim 6 further comprising:
    mounting a through silicon via die, a flip-chip, or a combination thereof to the back surface of the substrate and electrically connected within recessed contact pad.

11. An integrated circuit system comprising:
    a substrate with a face surface having a via therein and a back surface having a trench therein;
    a conductive pillar within the via;
    a recessed contact pad within the trench;
    solder that partially fills the recessed contact pad; and
    an under-bump metal having a base surface in electrical contact with the conductive pillar, and having a side that extends beyond and extends away from the face surface of the substrate and further extends beyond the base surface.

12. The system as claimed in claim 11 further comprising:
    an oxidation layer between the conductive pillar and the substrate and between the recessed contact pad and the substrate.

13. The system as claimed in claim 11 further comprising:
    a wiring layer near the face surface of the substrate and electrically connected to the conductive pillar.

14. The system as claimed in claim 11 further comprising:
    the substrate is an integrated circuit.

15. The system as claimed in claim 11 further comprising:
    an integrated circuit mounted to the back surface of the substrate, the integrated circuit having a conductive post mounted within the recessed contact pad and having the solder surrounding a portion of the conductive post above a top level of the recessed contact pad.

16. The system as claimed in claim 11 further comprising a solder bump, a conductive post, or a combination thereof formed in direct contact with the under-bump metal.

17. The system as claimed in claim 16 wherein:
    the conductive post has a width that is substantially similar to a width of the under-bump metal.

18. The system as claimed in claim 16 wherein:
    the conductive post has a width that is less than an inner width of the recessed contact pad.

19. The system as claimed in claim 16 further comprising:
    a passivation layer having a top surface near the face surface of the substrate; and
    a top flange of the under-bump metal in direct contact with the top surface of the passivation layer and the top flange is over the passivation layer.

20. The system as claimed in claim 16 further comprising:
    a through silicon via die, a flip-chip, or a combination thereof mounted to the back surface of the substrate and electrically connected within recessed contact pad.

* * * * *